United States Patent [19]
Choi

[11] Patent Number: 6,061,270
[45] Date of Patent: May 9, 2000

[54] METHOD FOR PROGRAMMING A NON-VOLATILE MEMORY DEVICE WITH PROGRAM DISTURB CONTROL

[75] Inventor: Jung-Dal Choi, Suwon, Rep. of Korea

[73] Assignee: SamSung Electronics Co., Ltd., Rep. of Korea

[21] Appl. No.: 09/221,555

[22] Filed: Dec. 28, 1998

[30] Foreign Application Priority Data

Dec. 31, 1997 [KR] Rep. of Korea ...................... 97-80587

[51] Int. Cl.⁷ ................................................. G11C 16/04
[52] U.S. Cl. .............................. 365/185.02; 365/185.17; 365/185.19
[58] Field of Search .................... 365/185.02, 185.17, 365/185.19, 185.33

[56] References Cited

U.S. PATENT DOCUMENTS 5,715,194  2/1998  Hu ....................................... 365/185.17
5,898,615  4/1999  Chida .................................. 365/185.17

OTHER PUBLICATIONS

Suh, Kang–Deog, et al., "A 3.3 V 32Mb NAND Flash Memory with Incremental Step Pulse Programming Scheme," IEEE Journal of Solid–State Circuits, vol. 30, No. 11, Nov. 1995, pp. 1149–1156.

Jung, Tae–Sung, et al., "A 3.3V 128Mb Multi–Level NAND Flash Memory for Mass Storage Applications," IEEE International Solid–State Circuits Conference, First Edition, Feb. 1996, pp. 32–33, 412.

Tomoharu, Tanaka, "A 4–Mbit NAND–EEPROM with Tight Programmed Vt Distribution," 1990 Symposium on VLSI Circuits, pp. 105–106.

*Primary Examiner*—Andrew Q. Tran
*Attorney, Agent, or Firm*—Samuels, Gauthier & Stevens LLP

[57] ABSTRACT

There is provided a non-volatile memory device programming method for improving soft programming. In the programming method, a first voltage for program inhibition is applied to a bit line, and a second voltage is applied to the gate of a first select transistor, unselected word lines, and a selected word line. Then, after blocking a current path, a third voltage is applied to the word line of a first unselected memory cell and the word line of a second unselected memory cell sharing the drain and the source of a memory cell on the selected word line in order to decouple the first and second unselected memory cells from the other unselected memory cells. A fourth voltage is applied to the unselected word lines except for the first and second unselected memory cells, thereby coupling the sources or drains of the first and second unselected memory cells and disconnecting the channel of the selected memory cell from those of the other unselected memory cells. Then, a program voltage is applied to the selected word line.

8 Claims, 8 Drawing Sheets

METHOD FOR PROGRAMMING A NON-VOLATILE MEMORY DEVICE WITH PROGRAM DISTURB CONTROL

BACKGROUND OF THE INVENTION

1. Field of the Invention

The present invention relates to a semiconductor memory device, and in particular, to an apparatus and method for programming a non-volatile memory device which is electrically erasable and programmable.

2. Description of the Related Art

Semiconductor memory devices are largely divided into RAMs (Random Access Memories) and ROMs (Read-Only Memories). RAMs are of various types such as DRAMs (Dynamic RAMs) and SRAMs (Static RAMs). RAMs are referred to as volatile memories since data stored in them is destroyed with passage of time. RAMs also allow rapid data storage and data retrieval. In contrast, ROMs retain data once it is entered but perform slow data storage and data retrieval. Among the various types of ROMs, demand for flash EEPROMs (Electrically Erasable and Programmable ROMs), in which data is electrically input and output, is increasing. A flash EEPROM device, which is electrically erasable at high speed without being removed from a circuit board, offers the advantages of simple memory cell structure, low cost per unit memory, and no need for a refresh function to retain data.

Flash EEPROM cells can be of two types, namely, a NOR type and a NAND type. The NOR type is not readily applicable to realization in high integration because one contact is required for every two cells. However, the NOR-type is useful for high-speed operation due to a high cell current. On the contrary, the NAND-type flash EEPROM can be packed on a chip with high density because a plurality of cells share one contact, though its low cell current impedes high-speed operation. Therefore, the NAND flash EEPROM device is receiving considerable attention as a next generation memory device for use in a digital still camera and similar devices.

FIGS. 1 and 2 contain a schematic sectional view and a schematic equivalent circuit diagram, respectively, of a cell array in a conventional NAND flash EEPROM device, as disclosed in, for example, in an article entitled, "A 4-Mbit NAND-EEPROM with Tight Programmed Vt Distribution," in 1990 Symposium on VLSI Circuits, pp. 105–106, 1990. Referring to FIGS. 1 and 2, a string of the NAND flash EEPROM cell array includes a string select transistor (SST) for selecting a unit string, a ground select transistor (GST) for selecting a ground, and a plurality of memory cell transistors MC1, . . . , and MC16 connected in series between the SST and the GST, each being stacked with a floating gate 18 and a control gate 21. One block has a plurality of such strings connected in parallel to bit lines B/L1, B/L2, . . . , and blocks are symmetrically arranged with respect to a bit line contact.

The transistors are arranged in a matrix of rows and columns. The gates of SSTs and GSTs in the same rows are connected to a string select line (SSL) and a ground select line (GSL), respectively, and the gates of memory cell transistors MC1, . . . , and MC16 in the same rows are connected to their respective corresponding word lines W/L1, . . . , and W/L16. The drain of the SST is coupled to a bit line B/L, and the source of the GST is coupled to a common source line (CSL).

In each of the memory cell transistors MC1, . . . , and MC16, the floating gate 18 is formed on a semiconductor substrate 10 with interposition of a tunnel oxide film 16, and the control gate 21 is stacked over the floating gate 18 with interposition of an interpoly dielectric layer 19. The floating gate 18 extends across an active region and portions of edges of field regions at opposite sides of the active region, thus being isolated from a floating gate 18 of an adjacent cell. The control gate 21 is connected to that of an adjacent cell, forming a word line W/L.

The floating gate 18 and the control gate 21 are coupled by a metal line through a butting contact on a field region of the cell array, in SSTs and GSTs, because they require no floating gates for storing data. Hence, the SSTs and GSTs operate as MOS transistors having a single layer gate structure in electrical terms.

The operation of such a NAND flash EEPROM cell will now be described. For a programming operation of the cell, electrons are injected from a channel region into a floating gate by Fowler-Nordheim (F-N) tunneling due to a large voltage difference between the channel region and a control gate of the cell transistor by applying 0 V and a program voltage Vpgm to a bit line and a word line connected to the selected cell transistor, respectively. During the operation, a pass voltage Vpass is applied to word lines connected to unselected cell transistors among a plurality of memory cells between the bit line and a ground node, to pass the data (i.e, 0 V) of the selected bit line to the selected cell transistor. Here, the threshold voltage of the cell transistor shifts to a positive voltage.

An erasing operation refers to removal of electrons from the floating gate. By applying an erase voltage Verase of about 20 V to a bulk and 0 V to the word line connected to the selected cell transistor, the electrons stored in the floating gate are replaced with holes due to an erase voltage-induced electric field directed opposite to that in the programming operation. During erasing, the initial threshold voltage of the cell transistor is about −3 V.

Reading of the cell is achieved by determining its data as "0" or "1" depending on the absence or presence of a current path through the selected cell transistor by applying 0 V to the selected word line, based on the principle that the threshold voltage Vth of the cell shifts to +1 V with electrons stored in the cell transistor and to −3 V with holes stored therein.

The programming of the cell is implemented following the erasing operation of all cell transistors, and unselected cell transistors should be inhibited from being programmed in order to prevent program disturbance of an unselected cell transistor connected to an unselected bit line of the selected word line during programming. A conventional program inhibition method utilizing a self-boosting scheme is provided by JSSC (Journal of Solid State Circuits), Vol. 30, No. 11, pp. 1149–1156, 1995 and will be described in connection with its circuit diagram in FIG. 3.

Referring to FIG. 3, to program cell A, for example, a ground path is blocked in the memory cell array by applying 0 V to the gate of a GST or a GSL. 0 V is applied to a selected bit line, and a power supply voltage Vcc of 3.3 V or 5 V is applied as a program inhibition voltage Vpi to unselected bit lines. At the same time, after the source of an SST is charged to (Vcc−threshold voltage $SST_{Vth}$ of SST) by applying the power supply voltage Vcc to the gate of the SST or an SSL, the SST is virtually blocked. The channel regions of cell transistors in the same string are charged to (Vcc−$SST_{Vth}$)/17 by charge sharing in the case of a 16-stage NAND type, by applying a program voltage Vpgm of about 18 V to a selected word line and a pass voltage Vpass of about 10 V to unselected word lines. By passing voltages applied to the selected word line, a channel voltage Vch of cell transistors is given as follows due to capacitive coupling caused by the high program voltage Vpgm on the selected word line:

$$Vch = \frac{Vcc - SST_{Vth}}{17} + Vboost;$$

$$Vboost = \left(\frac{Cins}{Cins + Cch}\right)\left(Vpgm - \frac{Cins}{Cins + Cch}\right)Vpass;$$

$$Cins = \frac{ConoCtun}{Cono + Ctun};$$

where Cch is a depletion capacitance generated by a depletion region under a channel and Cins is a total capacitance between a control gate and the channel.

Assuming that the program voltage Vpgm is 20 V and the pass voltage Vpass is 10 V, about 8 V is induced to the channel region of a program inhibited cell transistor. Then, F-N tunneling cannot take place between the floating gate and the channel, thereby keeping the program inhibited cell transistor in the initial erased state, that is, at a threshold voltage of −3 V.

In the conventional method, however, if the power voltage Vcc drops, the value [(Vcc−SST$_{Vth}$)/17+Vboost] also drops, and the potential difference between the channel voltage Vch of the program inhibited cell transistor and the program voltage Vpgm on the selected word line becomes large. As a result, soft-programming (hereinafter, referred to as Vpgm stress), caused by the program voltage Vpgm on the control gate of the selected cell transistor, becomes serious, and the program inhibited cell transistor is not kept at its initial erased status and has an increased threshold voltage. Moreover, unselected cell transistors in a string receiving 0 V on its bit line are subjected to soft-programming (hereinafter, referred to as Vpass stress) due to an increased voltage difference between their control gates and channels as the pass voltage Vpass is increased. As a result, their threshold voltages are increased. Therefore, an optimum pass voltage Vpass should be determined in a pass voltage range free of Vpgm and Vpass stresses.

FIG. 4 is a graph illustrating variation of a threshold voltage Vth of a program inhibited cell with respect to a pass voltage Vpass thereof with a program voltage Vpgm of 17 V, a total program stress time Tpgm of 3 ms, and a program inhibition voltage Vpi varied from 2.8 V through 3.8 V to 5 V in the conventional method. It is noted from FIG. 4 that the window of a pass voltage range free of Vpgm and Vpass stresses is gradually reduced with the decrease in the program inhibition voltage Vcc on a bit line.

Another problem with the conventional method is that a program disturbance window is decreased because of a programming time increased by three or more times and a program voltage increased by 3 V or higher during operation of a multi-bit NAND flash memory cell for recording two or more bit data per cell.

Another conventional program inhibition method relying on local self-boosting (LSB) to overcome the above conventional problems, disclosed in ISSCC Digest of Technical Papers, pp. 32–33, 1996, will be described referring to FIG. 5. Referring to FIG. 5, a decouple voltage Vdecouple of 0 V is applied to two unselected word lines adjacent to a selected word line. About 2 μs after a pass voltage Vpass of about 10 V is applied to the other unselected word lines, the program voltage Vpgm of about 18 V is applied to the selected word line. Then, the channel of a self-boosted cell transistor is confined to the selected word line and the boosting voltage Vboost is increased, resulting in improvement of Vpgm stress. According to the LSB method, the channel voltage Vch of a program inhibited cell transistor is calculated by $$Vch = \frac{Vcc - SST_{Vth}}{17} + Vboost;$$

and $$Vboost = \left(\frac{Cins}{Cins + Cch}\right)Vpgm.$$

Thus, Vpgm stress is more improved than in the program inhibition method using self-boosting described referring to FIG. 3.

FIG. 6 is a graph illustrating variation of a threshold voltage Vth of a program inhibited cell with respect to a pass voltage Vpass thereof, with the threshold voltage of a cell transistor receiving a decouple voltage varied from −5 V through −3 V to −1 V. Here, a program voltage Vpgm is 20 V, a total program stress time Tpgm is 2.4 ms, and a program inhibition voltage Vpi is 2.8 V.

Referring to FIG. 6, as the voltage Vcc on a bit line for program inhibition drops, the window of a pass voltage range free of Vpgm and Vpass stresses is improved by 3 V or higher, as compared to the conventional method shown in FIG. 4. However, when the initial threshold voltages of two cell transistors receiving the decouple voltage Vdecouple are overerased, the channel of a self-boosted cell transistor is not confined to a selected word line. Hence, as shown in FIG. 6, Vpgm stress increases and the threshold voltage varies to a large extent. In addition, if the initial threshold voltages of the two cell transistors receiving the decouple voltage Vdecouple are undererased, the voltage (Vcc−SST$_{Vth}$) to which the source of an SST is precharged fails to be substantially transported to the channel of a program inhibited cell. In the worst case where a cell transistor on the selected word line is programmed, the channel of the program inhibited cell transistor is precharged to [(Vdecouple(0 V)−Vth of cell transistor receiving Vdecouple)/17)]. Therefore, since the difference between the potentials of the channel voltage Vch of the program inhibited cell transistor and the program voltage Vpgm on the selected word line becomes large, Vpgm stress increases and the threshold voltage varies to a large extent, as shown in FIG. 6.

SUMMARY OF THE INVENTION

An object of the present invention is to provide a method for programming a non-volatile memory device, which can improve soft-programming of a program inhibited cell during a program operation.

To achieve the above object, there is provided a method for programming a non-volatile memory device. The non-volatile memory device has a memory cell array which includes a plurality of memory cells arranged in a matrix and first and second select transistors for selecting a memory cell. The device also includes a plurality of bit lines connected to drains of the memory cells and a plurality of word lines connected to control gates of the memory cells. In programming the non-volatile memory device, a first voltage for program inhibition is applied to the bit lines and a second voltage is applied to a gate of the first select transistor, unselected word lines, and a selected word line, to pass the first voltage without loss. The first voltage is applied to the gate of the first select transistor to block a current path across a bit line. Then, a third voltage is applied to the word line of a first unselected memory cell sharing the source of the memory cell on the selected word line and the word line of a second unselected memory cell sharing the drain of the memory cell on the selected word line, to decouple the first and second unselected memory cells from the other unselected memory cells. A fourth voltage is applied to the unselected word lines except for the word lines of the first and second memory cells to capacitively couple the sources or drains of the first and second unselected memory cells to a voltage higher than a difference between a gate voltage and a threshold voltage, so that the channel of the selected memory cell is isolated from those of the other unselected memory cells. Finally, a program voltage is applied to the selected word line.

In one embodiment, the first voltage is a power supply voltage Vcc. The second voltage can be higher than the first voltage. The third voltage can be lower than the first and second voltages, and, preferably, can be 0 V or lower. The fourth voltage can be higher than the first and second voltages.

According to the non-volatile memory device programming method of the present invention, by applying a voltage at or above [power supply voltage Vcc+threshold voltage of SST] to the gates of an SST and all cell transistors in the same string prior to application of a program voltage, a program inhibition voltage on a bit line is precharged regardless of the threshold voltage of the SST and the erase threshold voltages of selected and unselected cell transistors. Therefore, program disturbance characteristics caused by variation of process parameter can be improved, thereby ensuring uniform cell characteristics and increasing product yield.

BRIEF DESCRIPTION OF THE DRAWINGS

The foregoing and other objects, features, and advantages of the invention will be apparent from the following more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION OF THE PREFERRED EMBODIMENT

Figure 1:
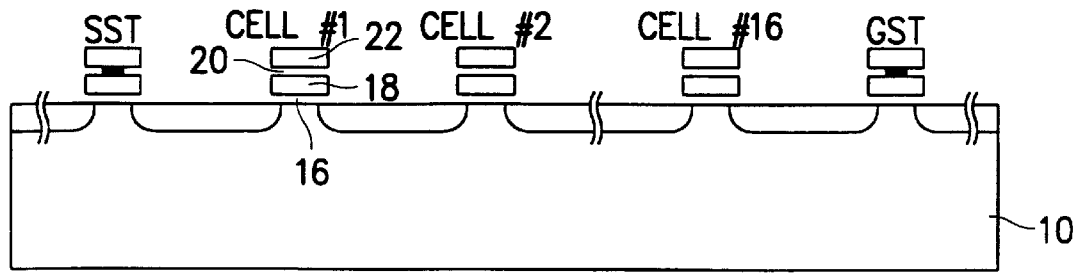
FIG. 1 is a schematic vertical sectional view of a cell array in a conventional NAND flash EEPROM device.
Figure 2:
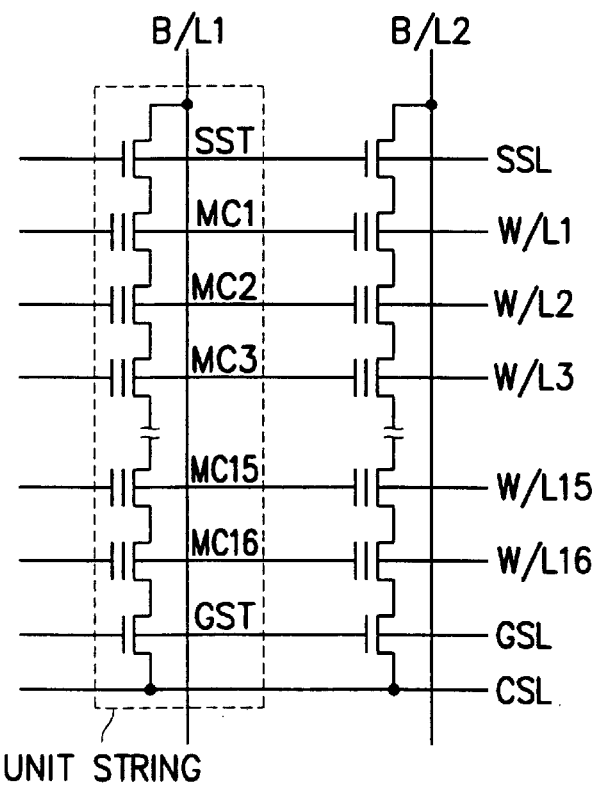
FIG. 2 is an equivalent circuit diagram of the cell array shown in FIG. 1.
Figure 3:
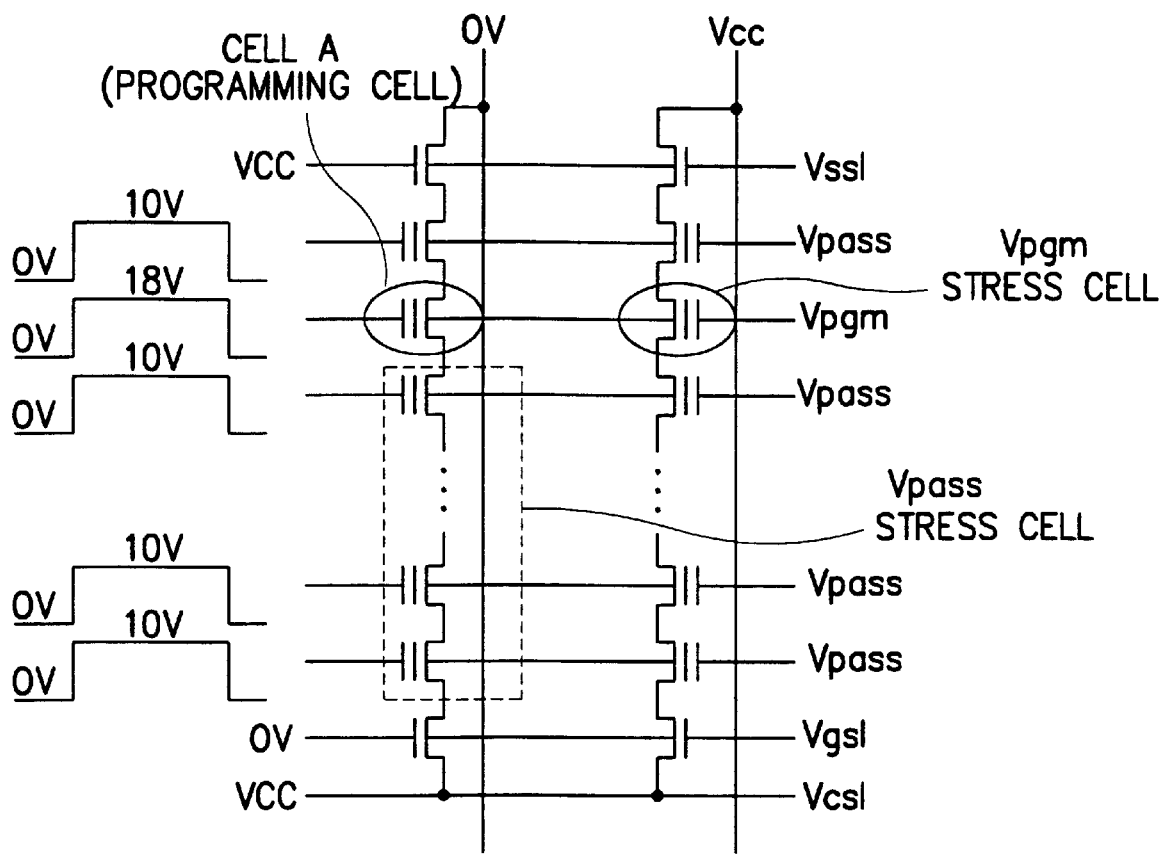
FIG. 3 is a circuit diagram of a NAND flash EEPROM device, referred to for describing a conventional cell programming method.
Figure 4:
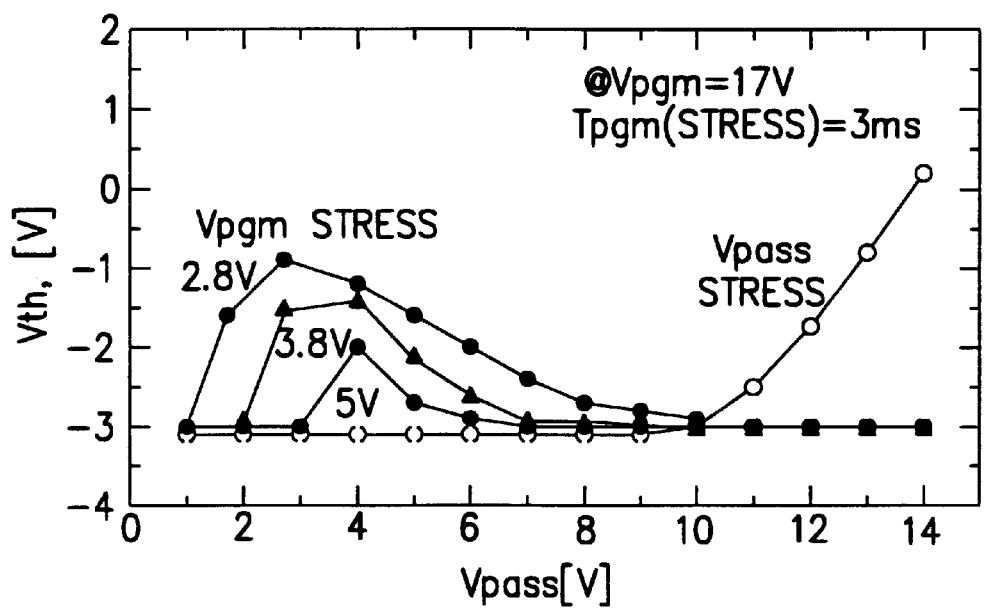
FIG. 4 is a graph illustrating variation of a threshold voltage of a program inhibited cell with respect to a pass voltage thereof in the device of FIG. 3.
Figure 5:
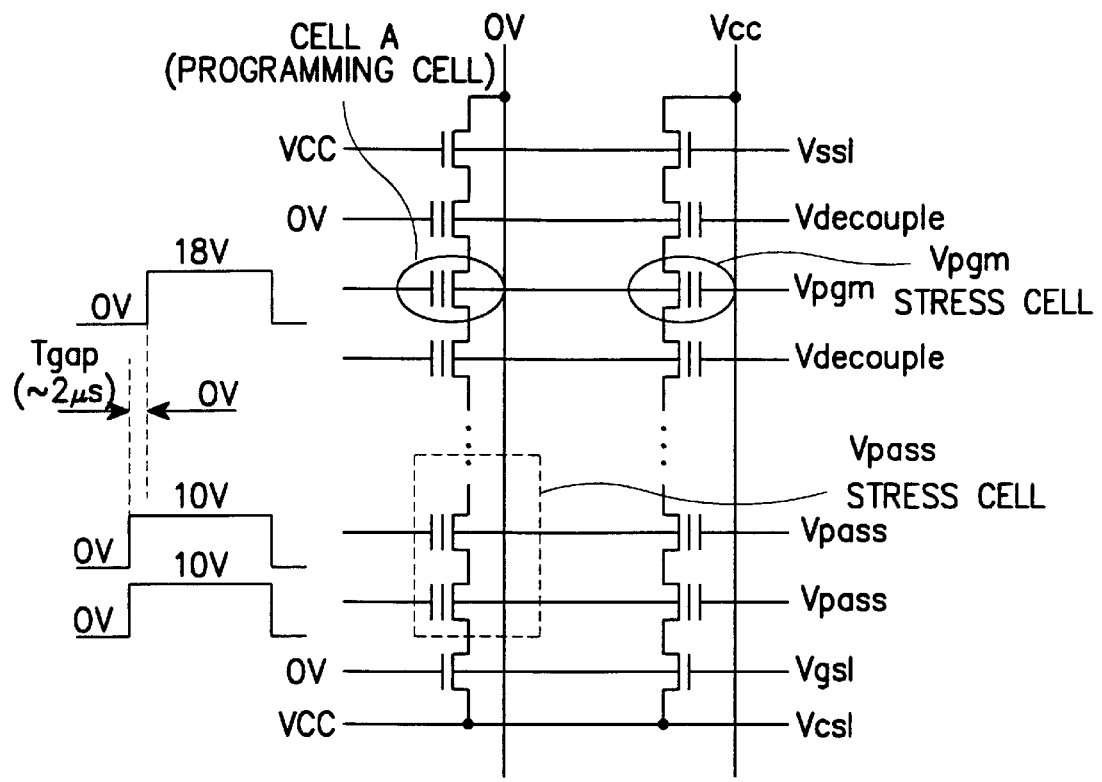
FIG. 5 is a circuit diagram of a NAND flash EEPROM device, referred to for describing another conventional cell programming method.
Figure 6:
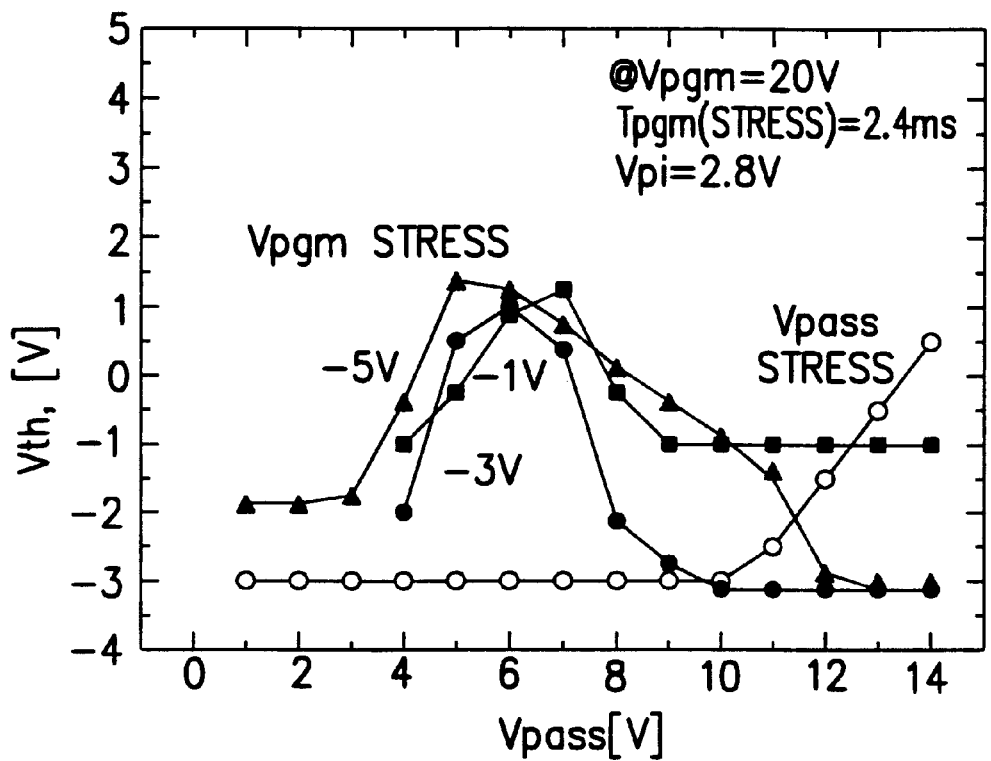
FIG. 6 is a graph illustrating variation of a threshold voltage of a program inhibited cell with respect to a pass voltage thereof in the device of FIG. 5.
Figure 7:
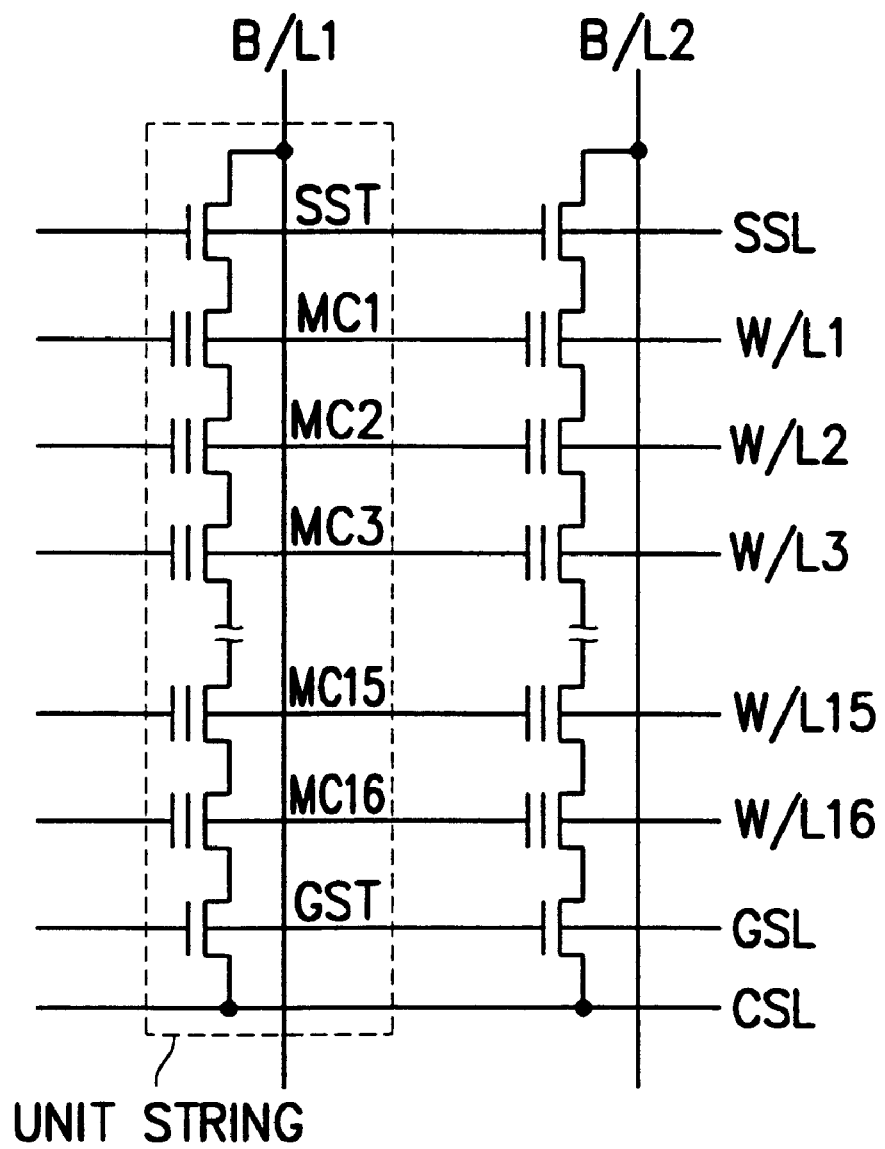
FIG. 7 is a circuit diagram of a cell array in a NAND flash EEPROM device according to the present invention.

FIG. 7 is a schematic equivalent circuit diagram of a cell array in a NAND flash EEPROM device according to the present invention. Referring to FIG. 7, a string includes an SST for selecting a unit string, a GST for selecting a ground, and a plurality of memory cell transistors MC1, . . . , and MC16 connected in series between the SST and GST, each having a floating gate and a control gate stacked thereon, in one embodiment of the NAND flash EEPROM cell array of the present invention. A block includes a plurality of such strings connected in parallel to bit lines B/L1, B/L2, . . . , and such blocks are symmetrically arranged with respect to a bit line contact. The transistors are arranged in a matrix of rows and columns. SSTs and GSTs in the same rows are connected to an SSL and a GSL, respectively. The gates of the memory cell transistors MC1, . . . , and MC16 arranged in the same rows are connected to their respective word lines W/L1, . . . , and W/L16. The drain of the SST is coupled to a bit line B/L, and the source of the GST is coupled to a CSL.

The floating gate of each of the memory cell transistors MC1, . . . , and MC16 extends across an active region and portions of edges of field regions at opposite sides of the active region, thus being isolated from the floating gate of an adjacent cell. The control gate of the cell is connected to that of an adjacent cell, forming a word line W/L.

Since in one embodiment SSTs and GSTs require no floating gates, the floating gates thereof are connected to the control gates by metal lines through butting contacts on a field region of a cell array. Hence, the SSTs and GSTs operate as MOS transistors having a single-layer gate in electrical terms.

Figure 8:
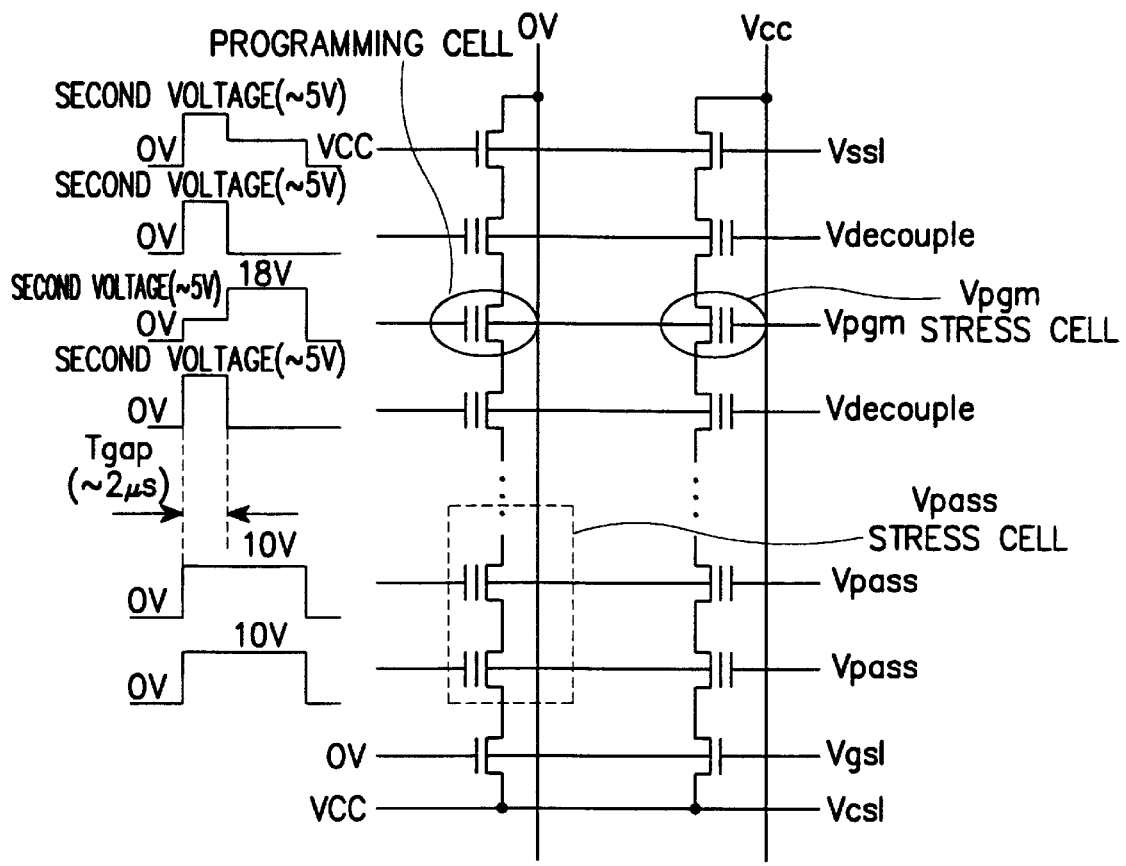
FIG. 8 is a circuit diagram referred to for describing a method for programming the NAND flash EEPROM device according to the present invention.

A description of programming of the NAND flash EEPROM device will hereinbelow be given referring to FIG. 8. Programming can follow erasing in the present invention as in the prior art. An erasing operation refers to removal of electrons from a floating gate. By applying an erase voltage Verase of about 20 V to a bulk and 0 V to a word line coupled to a selected cell transistor, the electrons are replaced with holes in the floating gate by an erase voltage-induced electric field directed opposite to that in a programming operation. The threshold voltage of the cell transistor is initially about −3 V by the erasing operation.

To program the cell after the erasing operation, the threshold voltage of the selected cell transistor is shifted to a positive voltage by injecting channel hot electrons onto the floating gate by F-N tunneling due to a large voltage difference between the channel and the control gate of the cell transistor through application of 0 V and the program voltage Vpgm to a bit line and a word line coupled to the selected cell transistor, respectively.

In the programming operation of a preferred embodiment, a ground path is blocked in the memory cell array by applying 0 V to the gate of a GST or a GSL, and the power supply voltage Vcc is applied to a CSL. Simultaneously, 0 V is applied to a selected bit line, while a first voltage Vcc is applied as a program inhibition voltage Vpi to unselected bit lines, as shown in FIG. 8, to prevent unselected cell transistors among cell transistors on a selected word line 30 from being programmed. By applying a second voltage higher than [Vcc+threshold voltage $SST_{Vth}$ of SST) to the gate of the SST or an SSL, unselected word lines 20, 40, 50, and 60 and the selected word line 30, the sources/drains and channels of all cell transistors in a selected string are precharged to the voltage Vcc on the bit lines. Here, the sources/drains and channels of the cell transistors in the selected string are precharged neither to (Vcc−SST$_{Vth}$/17) nor to [Vdecouple−(threshold voltage of cell transistor)] produced by undererasure resulting from process parameter variation-induced non-uniformity, in contrast to the conventional methods, because the SSL, the unselected word lines 20, 40, 50, and 60, and the selected word line 30 receive the second voltage higher than [Vcc+SST$_{Vth}$]. That is, if the voltage Vcc is 3 V and the threshold voltage of the SST is 1 V, the precharge voltage is 0.118 V in the prior art, while it is 3 V in the present invention. Here, because the threshold voltage of the SST is usually about 1 V, the second voltage on the SSL, the unselected word lines 20, 40, 50, and 60, and the selected word line 30 is preferably 5–7 V and lasts for about 2 μs. Then, a current path through the bit line is blocked by applying a voltage at or below Vcc to the SSL, while the source/drain and channel of the memory cell transistor are floated.

Thereafter, a third voltage, for example, 0 V, is applied to the word line 40 of a first unselected cell transistor sharing the source of the cell transistor on the selected word line 30 and the word line 20 of a second unselected cell transistor sharing the drain of the cell transistor on the selected word line, in order to decouple the first and second unselected cell transistors from the other unselected cell transistors. At the same time, a fourth voltage higher than the first and second voltages, that is, the pass voltage Vpass for passing the data 0 V on the selected bit line to the selected cell transistor, is applied to the unselected word lines 50 and 60 except for the word lines 20 and 40 of the first and second unselected cell transistors, so that the sources or drains of the first and second unselected cell transistors are capacitively coupled to a voltage higher than their gate voltage, preferably, the voltage calculated by [gate voltage−threshold voltage]. Thus, the channel of the selected cell transistor is prevented from being coupled to those of the unselected cell transistors on the word lines 50 and 60. Here, the third voltage, that is, the erase voltage Vdecouple should be lower than the first and second voltages, and the fourth voltage, that is, the boosting voltage Vboost capacitively coupled by the pass voltage Vpass is given by $$Vboost = \left[\frac{Cins}{(13Cins + Cch)}\right]Vpass;$$

where Cch is a depletion capacitance generated by a depletion region under the channel, and Cins is a total capacitance between the control gate and the channel, defined as $$Cins = \frac{ConoCtun}{Cono + Ctun}.$$

Subsequently, the program voltage Vpgm enabling F-N tunneling at or above [Vcc+SST$_{Vth}$] is applied to the selected word line 30. Here, the channel of a program inhibited cell transistor 70 is boosted to [Vcc+Vboost], suppressing injection of electrons onto the floating gate thereof. The boosting voltage Vboost is given as $$Vboost = \left(\frac{Cins}{Cins + Cch}\right)Vpgm.$$

Therefore, the channel voltage of the program inhibited cell transistor 70 is much higher than that in the conventional LSB method, given by $$Vch = \frac{Vcc - SST_{Vth}}{17} + Vboost.$$

Hence, Vpgm stress characteristics are improved in the present invention, as compared to the conventional method.

Figure 9:
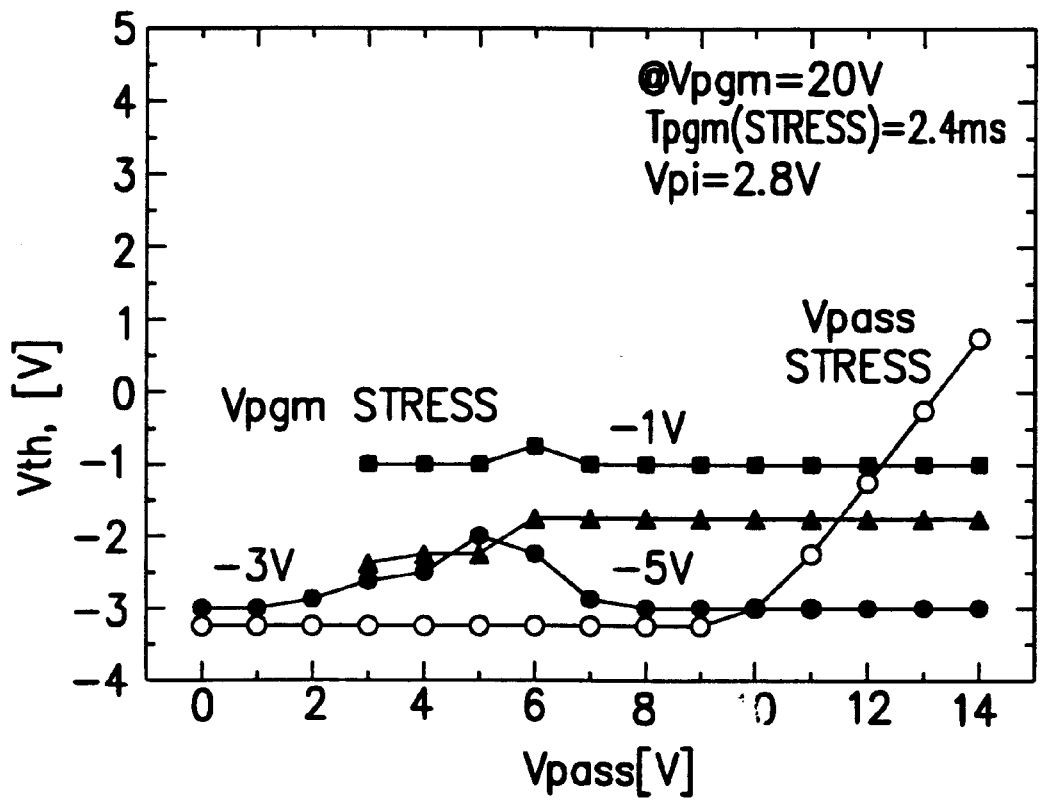
FIG. 9 is a graph illustrating variation of a threshold voltage of a program inhibited cell with respect to a pass voltage thereof in the device of FIG. 8.

FIG. 9 is a graph of variation of a threshold voltage Vth of a program inhibited cell with respect to a pass voltage Vpass thereof with an erase threshold voltage of a cell transistor receiving a decouple voltage given as a parameter, in the NAND flash EEPROM device of the present invention. Here, a program voltage Vpgm is 20 V, a total program stress time Tpgm is 2.4 ms, and a program inhibition voltage Vpi is 2.8 V.

Referring to FIG. 9, it is noted that the window of a pass voltage range free of Vpgm and Vpass stresses is improved by 3 V or higher, as compared to the conventional LSB method, though the erase threshold voltages of the cell transistors on unselected word lines 20 and 40 receiving a decouple voltage Vdecouple are changed from −5 V through −3 V to −1 V.

According to the non-volatile memory device programming method of the present invention as described above, by applying a voltage at or above the value [power supply voltage Vcc+threshold voltage of SST] to the gates of an SST and all cell transistors in the same string prior to application of a program voltage, a program inhibition voltage on a bit line is precharged regardless of the threshold voltage of the SST and the erase threshold voltages of selected and unselected cell transistors. Therefore, program disturbance characteristics caused by variation of process parameter can be improved, thereby ensuring uniform cell characteristics and increasing product yield.

While this invention has been particularly shown and described with reference to the preferred embodiments thereof, it will be understood by those skilled in the art that various changes in form and details may be made without departing from the spirit and scope of this invention as defined by the appended claims.

What is claimed is:

1. A method for programming a non-volatile memory device having a memory cell array which includes a plurality of memory cells arranged in a matrix and first and second select transistors for selecting a memory cell, a plurality of bit lines connected to drains of the memory cells, and a plurality of word lines connected to control gates of the memory cells, the method comprising the steps of:

(a) applying a first voltage for program inhibition to unselected bit lines and a second voltage to a gate of the first select transistor, unselected word lines, and a selected word line, to pass the first voltage without substantial loss;

(b) applying the first voltage to the gate of the first select transistor to block a current path across a bit line;

(c) applying a third voltage to the word line of a first unselected memory cell sharing the source of the memory cell on the selected word line and the word line of a second unselected memory cell sharing the drain of the memory cell on the selected word line, to decouple the first and second unselected memory cells from the other unselected memory cells, and applying a fourth voltage to the unselected word lines except for the word lines of the first and second unselected memory cells to capacitively couple the sources or drains of the first and second unselected memory cells to a voltage higher than the difference between a gate voltage and a threshold voltage, such that the channel of the selected memory cell is isolated from those of the other unselected memory cells; and (d) applying a program voltage to the selected word line.

2. The method of claim 1, further comprising the step of applying a fifth voltage to a selected bit line.

3. The method of claim 2, wherein the fifth voltage is zero volts.

4. The method of claim 1, wherein the first voltage is a power supply voltage.

5. The method of claim 1, wherein the second voltage is higher than the first voltage.

6. The method of claim 1, wherein the third voltage is lower than the first and second voltages.

7. The method of claim 6, wherein the third voltage is 0 V or lower.

8. The method of claim 6, wherein the fourth voltage is higher than the first and second voltages.

* * * * *